United States Patent
Katagiri

(10) Patent No.: US 12,269,097 B2
(45) Date of Patent: Apr. 8, 2025

(54) COATED CUTTING TOOL

(71) Applicant: TUNGALOY CORPORATION, Fukushima (JP)

(72) Inventor: Takao Katagiri, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 475 days.

(21) Appl. No.: 17/835,109

(22) Filed: Jun. 8, 2022

(65) Prior Publication Data

US 2023/0026334 A1    Jan. 26, 2023

(30) Foreign Application Priority Data

Jul. 19, 2021 (JP) .................................. 2021-118721

(51) Int. Cl.
   *B23B 27/14*    (2006.01)
   *C22C 29/08*    (2006.01)
   *C23C 14/06*    (2006.01)
   *C23C 14/32*    (2006.01)

(52) U.S. Cl.
   CPC ............ *B23B 27/148* (2013.01); *C22C 29/08* (2013.01); *C23C 14/0641* (2013.01); *C23C 14/325* (2013.01); *B23B 2228/105* (2013.01)

(58) Field of Classification Search
   None
   See application file for complete search history.

(56) References Cited

U.S. PATENT DOCUMENTS

| | | | |
|---|---|---|---|
| 2014/0193623 | A1 | 7/2014 | Setoyama et al. |
| 2017/0298505 | A1* | 10/2017 | Tatsuoka ................. C23C 16/34 |
| 2018/0281077 | A1* | 10/2018 | Tanaka ................ C23C 14/0641 |
| 2019/0249311 | A1* | 8/2019 | Sakurai ................. C23C 28/027 |

(Continued)

FOREIGN PATENT DOCUMENTS

| | | |
|---|---|---|
| EP | 4 108 366 A1 | 12/2022 |
| JP | 4112834 B2 | 7/2008 |
| JP | 2020-040175 A | 3/2020 |

(Continued)

OTHER PUBLICATIONS

K. Yamamoto et al., "Properties of (Ti,Cr,Al)N coatings with high Al content deposited by new plasma enhanced arc-cathode", Surface and Coatings Technology, vol. 174 -175, May 21, 2003, pp. 620-626.

*Primary Examiner* — Kim S. Horger
(74) *Attorney, Agent, or Firm* — Studebaker Brackett PLLC

(57) ABSTRACT

A coated cutting tool includes a substrate and a coating layer formed on the substrate, wherein the coating layer comprises a compound layer containing a compound having a composition represented by $(Al_xCr_yTi_{1-x-y})N$ (in the formula (1), x represents an atomic ratio of an Al element to a total of the Al element, a Cr element and a Ti element and satisfies $0.70 \leq x \leq 0.95$, and y represents an atomic ratio of a Cr element to a total of an Al element, the Cr element and a Ti element and satisfies $0.04 \leq y \leq 0.21$, and $1-x-y>0$); a ratio (Cr/Ti) of the Cr element and the Ti element in the compound layer is 1.0 or more and 2.5 or less; and an average thickness of the compound layer is 2.0 μm or more and 10.0 μm or less.

17 Claims, 1 Drawing Sheet

(56) References Cited

U.S. PATENT DOCUMENTS

2020/0080187 A1 3/2020 Katagiri
2021/0354204 A1* 11/2021 Fukunaga ......... C23C 16/45512

FOREIGN PATENT DOCUMENTS

| JP | 2020-109210 A | 7/2020 | |
|----|---------------|--------|--|
| WO | 2014/002948 A1 | 1/2014 | |
| WO | WO-2019098130 A1 * | 5/2019 | ........... B23B 27/148 |
| WO | 2021/167087 A1 | 8/2021 | |

* cited by examiner

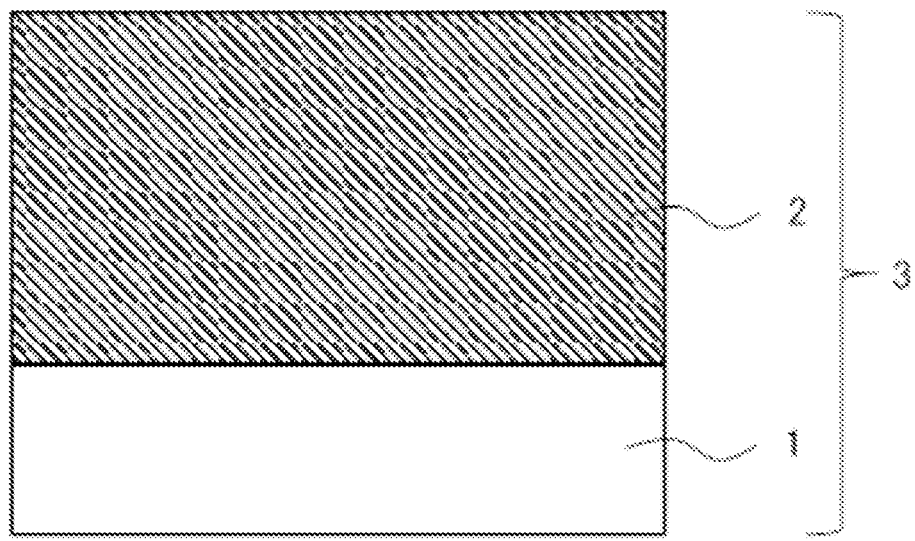

COATED CUTTING TOOL

BACKGROUND OF THE INVENTION

Field of the Invention

The present invention relates to a coated cutting tool.

Description of Related Art

In the related art, cutting tools made of cemented carbide or cubic boron nitride (cBN) sintered body have been widely used for cutting steel or the like. Among them, surface coated cutting tools containing one or two or more hard coating films such as a TiN layer, a TiAlN layer and a AlCrN layer on a surface of a cemented carbide substrate are used for various processing due to high versatility thereof.

Among such tools, surface coated cutting tools having an atomic ratio of Al in the AlCrN layer of 70% or more have a reduced hardness due to the inclusion of hexagonal crystals, hence the wear resistance of the tools is lowered.

In order to resolve such a problem, for example, Patent Publication JP-A-2020-109210 proposes a film forming method for forming a hard film containing AlCrN or the like containing cubic crystals (atomic ratio of Al is 80% or more). Specifically, proposed is a film forming method for forming a hard film by using a cathode arc ion plating device having inside thereof a target composed of $Al_xCr_yM_z$ ($0.80 \leq x \leq 0.95$, $0.05 \leq y+z \leq 0.20$, $z \leq 0.05$; x is the atomic ratio of Al, y is the atomic ratio of Cr, and z is the atomic ratio of M. M represents any element of Ti, V, Zr, and Nb), wherein the hard film is formed with a bias voltage applied to the substrate installed in the cathode arc ion plating device in the range of −100V to −150V and the substrate temperature in the range of 330° C. to 370° C.

SUMMARY

Technical Problem

However, although the crystal system of the hard film produced by the film forming method described in Patent Publication JP-A-2020-109210 is a cubic crystal system, the compressive stress is very high, peeling occurs after the hard film is formed and the thickness of the hard film is difficult to increase. Therefore, it is difficult to extend the tool life of the coated cutting tool having the hard film described in Patent Publication JP-A-2020-109210 due to insufficient wear resistance.

The present invention has been made in light of the above circumstances, and an object of the present invention is to provide a coated cutting tool having improved wear resistance and fracture resistance and a long tool life.

Solution to Problem

The present inventor has conducted research on extending a tool life of a coated cutting tool, and has found that when the coating layer in a coated cutting tool has a specific configuration, it is possible to improve wear resistance and fracture resistance thereof, and as a result, the tool life of the coated cutting tool can be extended. Thus, the invention has been completed.

That is, the gist of the present invention is as follows.

[1] A coated cutting tool comprising a substrate and a coating layer formed on the substrate, wherein the coating layer comprises a compound layer containing a compound having a composition represented by a following formula (1):

$$(Al_xCr_yTi_{1-x-y})N \quad (1)$$

(in the formula (1), x represents an atomic ratio of an Al element to a total of the Al element, a Cr element and a Ti element and satisfies $0.70 \leq x \leq 0.95$, and y represents an atomic ratio of a Cr element to a total of an Al element, the Cr element and a Ti element and satisfies $0.04 \leq y \leq 0.21$, and $1-x-y>0$);

a ratio (Cr/Ti) of a Cr element and a Ti element in the compound layer is 1.0 or more and 2.5 or less; and an average thickness of the compound layer is 2.0 μm or more and 10.0 μm or less.

[2] The coated cutting tool according to [1], wherein a residual stress of the compound layer is −10.0 GPa or more and −2.0 GPa or less.

[3] The coated cutting tool according to [1] or [2], wherein an average grain size of grains in the compound layer is 10 nm or more and 300 nm or less.

[4] The coated cutting tool according to any one of [1] to [3], wherein where a diffraction peak intensity of a cubic crystal (200) plane is denoted by $I_{cub}(200)$ and a diffraction peak intensity of a hexagonal crystal (100) plane is denoted by $I_{hex}(100)$, $I_{hex}(100)/I_{cub}(200)$ is 0.2 or less.

[5] The coated cutting tool according to any one of [1] to [4], wherein the compound layer comprises a columnar crystal structure.

Advantageous Effects of Invention

According to the present invention, it is possible to provide a coated cutting tool having improved wear resistance and fracture resistance and a long tool life.

BRIEF DESCRIPTION OF DRAWINGS

The FIGURE is a schematic view showing an example of a coated cutting tool of the present invention.

DETAILED DESCRIPTION

Hereinafter, an embodiment for implementing the invention (hereinafter, simply referred to as "the present embodiment") will be described in detail, but the invention is not limited to the following embodiment. The invention can be modified in various ways without departing from the gist thereof. In the drawings, the same elements are designated by the same reference numerals, and repeated description will be omitted. Further, unless otherwise specified, a positional relationship such as up, down, left, and right is based on a positional relationship shown in the drawing. Furthermore, a dimensional ratio in the drawing is not limited to a ratio shown.

The coated cutting tool of the present embodiment comprises a substrate and a coating layer formed on the substrate, wherein the coating layer includes a compound layer containing a compound having a composition represented by a following formula (1)

$$(Al_xCr_yTi_{1-x-y})N \quad (1)$$

(in the formula (1), x represents the atomic ratio of an Al element to the total of the Al element, a Cr element and a Ti element and satisfies $0.70 \leq x \leq 0.95$, and y represents the atomic ratio of a Cr element to the total of an Al element, the Cr element and a Ti element and satisfies $0.04 \leq y \leq 0.21$, and $1-x-y>0$);

the ratio (Cr/Ti) of the Cr element and the Ti element in the compound layer is 1.0 or more and 2.5 or less; and an average thickness of the compound layer is 2.0 μm or more and 10.0 μm or less.

Factors why such a coated cutting tool has improved wear resistance and fracture resistance and a long tool life are not clear in detail, but the present inventor considers the factors as follows. However, the factors are not limited thereto. Specifically, when x in the composition $(Al_xCr_yTi_{1-x-y})N$ of the compound in the compound layer forming the coating layer is 0.70 or more, the hardness is increased, so that the wear resistance of the coated cutting tool is improved. Meanwhile, when x in the composition $(Al_xCr_yTi_{1-x-y})N$ of the compound in the compound layer forming the coating layer is 0.95 or less, the formation of a hexagonal structure can be suppressed, so that the hardness is increased, and as a result, the wear resistance of the coated cutting tool is improved. Further, when y in the composition $(Al_xCr_yTi_{1-x-y})N$ of the compound in the compound layer forming the coating layer is 0.04 or more, due to inclusion of Cr the high-temperature strength of the compound layer is improved and the formation of hexagonal crystals is suppressed, whereby the wear resistance of the coated cutting tool is improved. Meanwhile, when y in the composition $(Al_xCr_yTi_{1-x-y})N$ of the compound in the compound layer forming the coating layer is 0.21 or less, Cr is contained in an appropriate amount, whereby high-temperature strength is improved, and since the formation of cubic crystals is facilitated, hardness is increased. As a result, the wear resistance of the coated cutting tool is improved. Further, when 1−x−y>0 in the composition $(Al_xCr_yTi_{1-x-y})N$ of the compound in the compound layer forming the coating layer, adhesion of the compound layer is improved and the fracture resistance and wear resistance of the coated cutting tool are improved since Ti is contained. Further, when the ratio (Cr/Ti) of Cr element and Ti element in the compound layer forming the coating layer is 1.0 or more, the ratio of Cr element increases, so that the high-temperature strength is improved, and the ratio of Ti element decreases, so that the formation of a hexagonal structure can be suppressed. Meanwhile, when the ratio (Cr/Ti) of Cr element and Ti element in the compound layer forming the coating layer is 2.5 or less, the adhesion of the compound layer is improved, and the chipping resistance and wear resistance are improved. Further, when the average thickness of the compound layer forming the coating layer is 2.0 μm or more, the wear resistance of the coated cutting tool is improved. Meanwhile, when the average thickness of the compound layer forming the coating layer is 10.0 μm or less, the peeling of the coating layer is suppressed, so that the fracture resistance of the coated cutting tool is improved. Combined with these effects, the coated cutting tool of the present embodiment has improved wear resistance and fracture resistance and a long tool life.

The coated cutting tool of the present embodiment includes a substrate and a coating layer formed on the surface of the substrate. The substrate used in this embodiment is not particularly limited as long as it can be used for a coated cutting tool. Examples of such a substrate include a cemented carbide, a cermet, a ceramic, a cubic boron nitride sintered body, a diamond sintered body, and high-speed steel. Among them, the substrate is preferably one or more selected from a group consisting of a cemented carbide, a cermet, a ceramic, and a cubic boron nitride sintered body, because more excellent fracture resistance of the coated cutting tool can be realized.

Compound Layer

In the coated cutting tool of the present embodiment, the coating layer includes a compound layer containing a compound having a composition represented by the following formula (1).

$$(Al_xCr_yTi_{1-x-y})N \qquad (1)$$

(in the formula (1), x represents the atomic ratio of an Al element to the total of the Al element, a Cr element and a Ti element and satisfies 0.70≤x≤0.95, and y represents the atomic ratio of a Cr element to the total of an Al element, the Cr element and a Ti element and satisfies 0.04≤y≤0.21, and 1−x−y>0).

When x in the composition $(Al_xCr_yTi_{1-x-y})N$ of the compound in the compound layer forming the coating layer is 0.70 or more, the hardness is increased, so that the wear resistance of the coated cutting tool is improved. Meanwhile, when x in the composition $(Al_xCr_yTi_{1-x-y})N$ of the compound in the compound layer forming the coating layer is 0.95 or less, the formation of a hexagonal structure can be suppressed, so that the hardness is increased, and as a result, the wear resistance of the coated cutting tool is improved. From the same viewpoint, x in the composition $(Al_xCr_yTi_{1-x-y})N$ of the compound is preferably 0.70 or more and 0.93 or less, and more preferably 0.75 or more and 0.90 or less. Further, when y in the composition $(Al_xCr_yTi_{1-x-y})N$ of the compound in the compound layer forming the coating layer is 0.04 or more, due to inclusion of Cr the high-temperature strength of the compound layer is improved and the formation of hexagonal crystals is suppressed, whereby the wear resistance of the coated cutting tool is improved. Meanwhile, when y in the composition $(Al_xCr_yTi_{1-x-y})N$ of the compound in the compound layer forming the coating layer is 0.21 or less, Cr is contained in an appropriate amount, whereby high-temperature strength is improved, and since the formation of cubic crystals is facilitated, hardness is increased. As a result, the wear resistance of the coated cutting tool is improved. From the same viewpoint, y in the composition $(Al_xCr_yTi_{1-x-y})N$ of the compound is preferably 0.07 or more and 0.21 or less, and more preferably 0.07 or more and 0.15 or less. Further, when 1−x−y>0 in the composition $(Al_xCr_yTi_{1-x-y})N$ of the compound in the compound layer forming the coating layer, adhesion of the compound layer is improved and the fracture resistance and wear resistance of the coated cutting tool are improved since Ti is contained. Further, 1−x−y, that is, the atomic ratio of Ti element in the composition $(Al_xCr_yTi_{1-x-y})N$ of the compound in the compound layer forming the coating layer is preferably 0.03 or more and 0.21 or less, and more preferably 0.03 or more and 0.15 or less.

In the composition of the compound $(Al_xCr_yTi_{1-x-y})N$, the total atomic ratio of the Al element, the Cr element and the Ti element is 1.0.

In the coated cutting tool of the present embodiment, the ratio (Cr/Ti) of the Cr element and the Ti element in the compound layer forming the coating layer is 1.0 or more and 2.5 or less. When the ratio (Cr/Ti) of the Cr element and the Ti element in the compound layer forming the coating layer is 1.0 or more, the ratio of the Cr element increases, so that the high-temperature strength is improved, and the ratio of the Ti element decreases, so that the formation of a hexagonal structure can be suppressed. Meanwhile, when the ratio (Cr/Ti) of the Cr element and the Ti element in the compound layer forming the coating layer is 2.5 or less, the adhesion of the compound layer is improved, and the chipping resistance and wear resistance are improved.

Further, in the present embodiment, when the composition of the compound layer is expressed as $(Al_{0.80}Cr_{0.10}Ti_{0.10})N$, it means that the atomic ratio of an Al element to the total of the Al element, a Cr element and a Ti element is 0.80, the atomic ratio of the Cr element to the total of the Al element, the Cr element and the Ti element is 0.10, and the atomic ratio of the Ti element to the total of the Al element, the Cr element and the Ti element is 0.10. That is, it means that the amount of the Al element is 80 atomic % with respect to the total of the Al element, the Cr element and the Ti element, the amount of the Cr element is 10 atomic % with respect to the total of the Al element, the Cr element and the Ti element, and the amount of the Ti element is 10 atomic % with respect to the total of the Al element, the Cr element and the Ti element.

In the coated cutting tool of the present embodiment, the average thickness of the compound layer forming the coating layer is 2.0 μm or more and 10.0 μm or less. When the average thickness of the compound layer forming the coating layer is 2.0 μm or more, the wear resistance of the coated cutting tool is improved. Meanwhile, when the average thickness of the compound layer forming the coating layer is 10.0 μm or less, the peeling of the coating layer is suppressed, and the fracture resistance of the coated cutting tool is improved. From the same viewpoint, the average thickness of the compound layer forming the coating layer is preferably 2.0 μm or more and 8.5 μm or less, and more preferably 3.0 μm or more and 8.5 μm or less.

Further, in the coated cutting tool of the present embodiment, it is preferable that the residual stress of the compound layer be −10.0 GPa or more and −2.0 GPa or less. When the residual stress of the compound layer is −10.0 GPa or more, the occurrence of cracks after the coating layer is formed can be suppressed, and the coating layer can be thickened, so that the wear resistance of the coated cutting tool tends to be improved. Meanwhile, when the residual stress of the compound layer is −2.0 GPa or less, the crack propagation can be suppressed by the effect of having the compressive stress, so that the fracture resistance of the coated cutting tool tends to be improved. From the same viewpoint, the residual stress of the compound layer is more preferably −9.8 GPa or more and −2.2 GPa or less, and more preferably −9.6 GPa or more and −2.5 GPa or less.

The above residual stress refers to an internal stress (inherent distortion) remaining in the coating layer. In general, a stress represented by a "−" (minus) value is referred to as a compressive stress, and a stress represented by a "+" (plus) value is referred to as a tensile stress. In the present embodiment, when indicating the magnitude of a residual stress, a greater "+" value means a greater residual stress, and a smaller "−" value means a smaller residual stress.

The above residual stress can be measured by a $\sin^2\varphi$ method using an X-ray diffractometer. Such residual stress can be measured by: measuring, through the $\sin^2\varphi$ method, the stresses at any three locations included in a portion involved in cutting (such locations are preferably selected so as to be apart from one another by 0.5 mm or more, such that the relevant stresses typify the stresses of the above portion); and obtaining the average value of such stresses.

Further, in the coated cutting tool of the present embodiment, it is preferable that the average grain size of the grains in the compound layer be 10 nm or more and 300 nm or less. When the average grain size of the grains in the compound layer is 10 nm or more, the compressive stress is prevented from becoming too high, the peeling of the compound layer is suppressed, and the fracture resistance of the coated cutting tool tends to be improved. Meanwhile, when the average grain size of the grains in the compound layer is 300 nm or less, the compound layer has a high hardness and the wear resistance of the coated cutting tool tends to be improved. From the same viewpoint, the average grain size of the grains in the compound layer is more preferably 12 nm or more and 295 nm or less, and further preferably 14 nm or more and 292 nm or less.

Further, in the coated cutting tool of the present embodiment, it is preferable that the compound layer have a columnar crystal structure. In the coated cutting tool of the present embodiment, when the compound layer has a columnar crystal structure, the grains are prevented from falling off, so that the effect of the coating layer is exhibited for a long time, and therefore the wear resistance tends to be further improved.

In the present embodiment, the shape, aspect ratio and average grain size of the grains in the compound layer can be measured by using a commercially available transmission electron microscope (TEM). Specifically, for example, first, by using a focused ion beam (FIB) processing machine, a thin film sample with a cross section in the compound layer (a cross section in a direction same as a direction of observing the thickness of the coating layer: perpendicular to the surface of the substrate) as an observation surface is prepared. A photograph of a scanning transmission electron image (STEM image) is taken on the observation surface of the prepared sample. The STEM image at this time preferably includes the entire region occupied by the compound layer in the direction perpendicular to the substrate, and preferably includes a region of 10 μm or more in the direction parallel to the surface of the substrate. In the photograph taken, the value of an axis in the direction parallel to the surface of the substrate in a grain constituting the compound layer is taken as the grain size for all the grains present in the compound layer, and the average value thereof is taken as the average grain size of the compound layer.

Further, the aspect ratio of the compound layer is obtained in the following manner. In the crystal grains used for measuring the average grain size, the size of the axis in the thickness direction of the coating layer is defined as the height of the crystal grain. The value obtained by dividing the height of the crystal grain by the value of the grain size is defined as the aspect ratio.

When the number of crystal grains having an aspect ratio of 2 or more in the compound layer measured as described above is 50% or more of the total number of crystal grains, it is assumed that the columnar crystal structure is realized. Further, when the number of crystal grains having an aspect ratio of 2 or more in the compound layer measured as described above is less than 50% of the total number of crystal grains, that is, the number of crystal grains having an aspect ratio of less than 2 is 50% or more of the total number of crystal grains, it is assumed that a granular crystal structure is realized.

Further, in the coated cutting tool of the present embodiment, when the diffraction peak intensity of the cubic crystal (200) plane is denoted by $I_{cub}(200)$ and the diffraction peak intensity of the hexagonal crystal (100) plane is denoted by $I_{hex}(100)$ in the compound layer, $I_{hex}(100)/I_{cub}(200)$ is preferably 0.2 or less. When $I_{hex}(100)/I_{cub}(200)$ is 0.2 or less in the compound layer, the formation of a hexagonal structure is suppressed, so that the hardness increases and the wear resistance of the coated cutting tool tends to improve. From the same viewpoint, a lower $I_{hex}(100)/I_{cub}(200)$ in the compound layer is more preferable. A low $I_{hex}(100)/I_{cub}(200)$ indicates a high proportion of cubic crystals. The lower limit of $I_{hex}(100)/I_{cub}(200)$ is not particularly limited and is, for example, 0.

In the present embodiment, the peak intensity of each crystal plane of the compound layer can be measured by using a commercially available X-ray diffractometer. For example, the peak intensity of each crystal plane can be measured by using a model: RINT TTRIII, which is an X-ray diffractometer manufactured by Rigaku Co., Ltd., and performing X-ray diffraction measurement with a 2θ/θ focused optical system using Cu-Kα rays under the conditions of output: 50 kV, 250 mA, incident side solar slit: 5°, divergent vertical slit: 2/3°, divergent vertical limiting slit: 5 mm, scattering slit: 2/3°, light receiving side solar slit: 5°, light receiving slit: 0.3 mm, BENT monochromator, light receiving monochrome slit: 0.8 mm, sampling width: 0.01°, scan speed: 4°/min, and 2θ measurement range: 20° to 50°. When obtaining the peak intensity of each crystal plane from the X-ray diffraction pattern, the analysis software provided with the X-ray diffractometer may be used. In the analysis software, the intensity of each peak can be obtained by performing background processing and $K\alpha_2$ peak removal using a cubic approximation, and performing profile fitting using the Pearson-VII function. When various layers are formed between the compound layer and the substrate, the peak intensities can be measured by a thin-film X-ray diffraction method so as not to be affected by the layers. When various layers are formed on the side of the compound layer opposite that of the substrate, it is preferable to remove the various layers by buffing and then perform X-ray diffraction measurement. Further, in the present embodiment, the crystal system of the compound layer can be confirmed by X-ray diffraction measurement.

The FIGURE is a schematic cross-sectional view showing an example of a coated cutting tool of the present embodiment. The coated cutting tool 3 includes a substrate 1 and a coating layer 2 formed on the surface of the substrate 1.

Lower Layer

The coating layer used in the present embodiment may be composed of only the compound layer, but it is preferable to include a lower layer between the substrate and the compound layer. Accordingly, the adhesion between the substrate and the compound layer tends to be further improved. Among the suitable lower layers, from the same viewpoint as above, it is preferable that the lower layer contains a compound composed of at least one element selected from a group consisting of Ti, Zr, Hf, V, Nb, Ta, Cr, Mo, W, Al, Si and Y and at least one element selected from a group consisting of C, N, O and B, more preferably contains a compound composed of at least one element selected from a group consisting of Ti, V, Nb, Ta, Cr, Mo, W, Al, Si and Y and at least one element selected from a group consisting of C, N, O and B, and even more preferably contains a compound composed of at least one element selected from a group consisting of Ti, Ta, Cr, W, Al, Si, and Y and N. Further, the lower layer may be a single layer or may be a multilayer including two or more layers.

In the present embodiment, it is preferable that the average thickness of the lower layer be 0.1 μm or more and 3.5 μm or less because the adhesion between the substrate and the coating layer tends to be further improved. From the same viewpoint, the average thickness of the lower layer is more preferably 0.2 μm or more and 3.0 μm or less, and further preferably 0.3 μm or more and 2.5 μm or less.

Upper Layer

The coating layer used in the present embodiment may include an upper layer on the side of the compound layer opposite that of the substrate (that is, the upper layer of the compound layer), preferably on the surface of the compound layer. It is more preferable that the upper layer contains a compound composed of at least one element selected from a group consisting of Ti, Zr, Hf, V, Nb, Ta, Cr, Mo, W, Al, Si and Y, and at least one element selected from a group consisting of C, N, O and B, because the wear resistance is further improved. Further, from the same viewpoint as above, the upper layer more preferably contains a compound composed of at least one element selected from a group consisting of Ti, V, Nb, Ta, Cr, Mo, W, Al, Si and Y, and at least one element selected from a group consisting of C, N, O and B, and even more preferably contains at least one element selected from the group consisting of Ti, Nb, Ta, Cr, W, Al, Si, and Y, and N. Further, the upper layer may be a single layer or may be a multilayer including two or more layers.

In the present embodiment, it is preferable that the average thickness of the upper layer be 0.1 μm or more and 3.5 μm or less because the wear resistance tends to be more excellent. From the same viewpoint, the average thickness of the upper layer is more preferably 0.2 μm or more and 3.0 μm or less, and further preferably 0.3 μm or more and 2.5 μm or less.

Method for Manufacturing Coating Layer

A method of manufacturing the coating layer in the coated cutting tool of the present embodiment is not particularly limited, and includes, for example, a physical vapor deposition method such as an ion plating method, an arc ion plating method, a sputtering method, and an ion mixing method. Use of the physical vapor deposition method for forming the coating layer is preferred because a sharp edge can be formed. Among them, the arc ion plating method is more preferred because the adhesion between the coating layer and the substrate is more excellent.

Method for Manufacturing Coated Cutting Tool

A method of manufacturing the coated cutting tool of the present embodiment will be described below with reference to specific examples. The method of manufacturing the coated cutting tool of the present embodiment is not particularly limited as long as a configuration of the coated cutting tool can be implemented.

First, a substrate processed into a tool shape is housed in a reaction vessel of a physical vapor deposition device, and a metal evaporation source is disposed in the reaction vessel. Then, the inside of the reaction vessel is evacuated until a pressure thereof is a vacuum of $1.0 \times 10^{-2}$ Pa or less, and the substrate is heated to a temperature of 200° C. to 700° C. by a heater in the reaction vessel. After heating, Ar gas is introduced into the reaction vessel to make the pressure in the reaction vessel to 0.5 Pa to 5.0 Pa. In an Ar gas atmosphere with a pressure of 0.5 Pa to 5.0 Pa, a bias voltage of −500 V to −350 V is applied to the substrate, a current of 40 A to 50 A is flowed through a tungsten filament in the reaction vessel, and the surface of the substrate is subjected to an ion bombardment treatment with Ar gas. After the surface of the substrate is subjected to the ion bombardment treatment, the inside of the reaction vessel is evacuated until the pressure is a vacuum of $1.0 \times 10^{-2}$ Pa or less.

When forming the lower layer used in the present embodiment, the substrate is heated until the temperature reaches 400° C. to 600° C. After heating, gas is introduced into the reaction vessel to make the pressure in the reaction vessel to 0.5 Pa to 5.0 Pa. The gas is, for example, $N_2$ gas when the lower layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the lower layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas: $C_2H_2$ gas=95:5 to 85:15. Next, it is preferable that a bias voltage of −80 V to −40 V is applied to the substrate, and the metal evaporation source corresponding to a metal component of lower layer is evaporated by an arc discharge of an arc current of 100 A to 200 A to form the lower layer.

When forming the compound layer used in the present embodiment, the temperature of the substrate is controlled to be 200° C. to 300° C., nitrogen gas ($N_2$) is introduced into the reaction vessel, and the pressure in the reaction vessel is set to 8.0 Pa to 10.0 Pa. After that, a bias voltage of −400V to −200V may be applied to the substrate, and the metal evaporation source corresponding to the metal component of the compound layer may be evaporated by an arc discharge of 100 A to 200 A to form the compound layer. The thickness of the compound layer can be controlled by adjusting the arc discharge time of the metal evaporation source.

In order to set the X-ray diffraction intensity ratio $I_{hex}(100)/I_{cub}(200)$ in the compound layer used in the present embodiment to a predetermined value, it is possible to adjust the temperature of the substrate, adjust the bias voltage, adjust the atomic ratio of each metal element, or adjust the pressure in the reaction vessel. More specifically, when the temperature of the substrate is lowered (300° C. or lower) or the negative bias voltage is increased (direction away from zero) in the process of forming the compound layer, $I_{hex}(100)/I_{cub}(200)$ tends to be smaller. Further, when the atomic ratio of Al element is reduced and the atomic ratio of Cr element is increased in the process of forming the compound layer, $I_{hex}(100)/I_{cub}(200)$ tends to be smaller, and when the ratio (Cr/Ti) of the atomic ratio of Cr element to the atomic ratio of Ti element is increased, $I_{hex}(100)/I_{cub}(200)$ tends to be smaller. Further, when the pressure in the reaction vessel is increased (8.0 Pa or more) in the process of forming the compound layer, $I_{hex}(100)/I_{cub}(200)$ tends to be larger.

In order to convert the structure of the compound layer used in this embodiment into a columnar crystal structure, the temperature of the substrate or the bias voltage may be adjusted in the process of forming the abovementioned compound layer. More specifically, when the temperature of the substrate is lowered (300° C. or less) or the negative bias voltage is increased (in the direction away from zero) in the process of forming the compound layer, the structure in the compound layer tends to become a columnar crystal structure. When the average grain size of the grains in the compound layer is too small, the aspect ratio of the grains tend to be less than 2, and the structure in the compound layer tends to be a granular crystal structure. Further, when the atomic ratio of Al element is too large, or the atomic ratio of Cr element is too small or the Cr element is not contained in the process of forming the compound layer, the structure of the compound layer tends to become a granular crystal structure.

In order to set the average grain size of the grains in the compound layer used in the present embodiment to a predetermined value, it is possible to adjust the temperature of the substrate, the bias voltage, or the atomic ratio of each metal element in the process of forming the abovementioned compound layer. More specifically, when the temperature of the substrate is increased or the negative bias voltage is decreased (close to zero) in the process of forming the compound layer, the average grain size of the grains in the compound layer tends to decrease. Further, when the atomic ratio of Ti element is increased or the atomic ratio of Al element is increased in the process of forming the compound layer, the average grain size of the grains in the compound layer tends to decrease.

In order to set the residual stress in the compound layer used in the present embodiment to a predetermined value, it is possible to create a nitrogen gas ($N_2$) atmosphere inside the reaction vessel and adjust the pressure, to adjust the temperature of the substrate, or to adjust the bias voltage in the abovementioned process of forming the compound layer. More specifically, when a nitrogen gas ($N_2$) atmosphere is created inside the reaction vessel and the pressure inside the reaction vessel is increased (8.0 Pa or more), the temperature of the substrate is raised, or the negative bias voltage is made small (near zero), the residual stress in the compound layer tends to be large.

When forming the upper layer used in the present embodiment, it is preferable that the upper layer is formed under the same manufacturing conditions as those of the lower layer described above. That is, first, the substrate is heated until the temperature thereof reaches 400° C. to 600° C. After heating, gas is introduced into the reaction vessel to make the pressure in the reaction vessel to 0.5 Pa to 5.0 Pa. The gas is, for example, $N_2$ gas when the upper layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the upper layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas: $C_2H_2$ gas=95:5 to 85:15. Next, it is preferable that a bias voltage of −80 V to −40 V is applied to the substrate, and the metal evaporation source corresponding to a metal component of upper layer is evaporated by an arc discharge of an arc current of 100 A to 200 A to form the upper layer.

The thickness of each layer forming the coating layer in the coated cutting tool of the present embodiment is measured from a cross-sectional structure of the coated cutting tool using an optical microscope, a scanning electron microscope (SEM), a transmission electron microscope (TEM), or the like. The average thickness of each layer in the coated cutting tool of the present embodiment can be obtained by measuring the thickness of each layer from three or more cross sections in the vicinity of a position 50 μm from a cutting edge ridgeline portion of a surface facing the metal evaporation source toward a center portion of the surface and by calculating an average value (arithmetic mean value).

Further, the composition of each layer forming the coating layer in the coated cutting tool of the present embodiment can be measured from the cross-sectional structure of the coated cutting tool of the present embodiment by using an energy dispersive X-ray analyzer (EDS) or a wavelength dispersive X-ray analyzer (WDS).

It is considered that the coated cutting tool of the present embodiment has an effect that the tool life can be extended as compared with that in the related art because the coated cutting tool is excellent in at least wear resistance and fracture resistance (however, the factors that can extend the tool life are not limited to the above). Specific examples of types of the coated cutting tool of the present embodiment include an indexable cutting insert for milling or lathe processing, a drill, or an end mill.

EXAMPLES

Hereinafter, the invention will be described in more detail by way of Examples, but the present invention is not limited to these examples.

Example 1

As a substrate, an insert of SWMT13T3AFPR-MJ (manufactured by Tungaloy Corporation) (a cemented carbide having a composition of 89.8% WC–9.8% Co–0.4% $Cr_3C_2$ (mas %)) was prepared. A metal evaporation source was arranged in the reaction vessel of the arc ion plating device so as to obtain the composition of the compound layer shown in Table 1. The prepared substrate was fixed to a fixing bracket of a rotary table in the reaction vessel.

After that, the inside of the reaction vessel was evacuated until the pressure reached a vacuum of $5.0×10^{-3}$ Pa or less.

After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of –400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0×10^{-3}$ Pa or less.

For the invention samples 1 to 19 and the comparative samples 1 to 10, after vacuuming, the substrate was controlled so that the temperature thereof became such as shown in Table 2 (the temperature at the start of film formation), nitrogen gas ($N_2$) was introduced into the reaction vessel, and the pressure inside the reaction vessel was adjusted to that shown in Table 2. Then, the bias voltage shown in Table 2 was applied to the substrate to evaporate the metal evaporation source of the compound layer having the composition shown in Table 1 by the arc discharge of the arc current shown in Table 2, and a compound layer was formed on the surface of the substrate. At this time, the pressure in the reaction vessel was controlled to that shown in Table 2. Further, the thickness of the compound layer was controlled by adjusting each arc discharge time so as to have the thickness shown in Table 1.

After forming the compound layer on the surface of the substrate to the predetermined average thickness shown in Table 1, the power of the heater was turned off, and after the sample temperature became 100° C. or lower, the sample was taken out from the reaction vessel.

TABLE 1

| | Coating layer | | | | |
|---|---|---|---|---|---|
| | Compound layer $(Al_xCr_yTi_{1-x-y})N$ | | | | |
| Sample No. | Al atomic ratio x | Cr atomic ratio y | Average thickness (μm) | Ti atomic ratio 1-x-y | Cr/Ti ratio |
| Invention sample 1 | 0.80 | 0.12 | 5.0 | 0.08 | 1.5 |
| Invention sample 2 | 0.70 | 0.15 | 5.0 | 0.15 | 1.0 |
| Invention sample 3 | 0.93 | 0.04 | 5.0 | 0.03 | 1.3 |
| Invention sample 4 | 0.70 | 0.21 | 5.0 | 0.09 | 2.3 |
| Invention sample 5 | 0.80 | 0.12 | 2.0 | 0.08 | 1.5 |
| Invention sample 6 | 0.80 | 0.12 | 10.0 | 0.08 | 1.5 |
| Invention sample 7 | 0.80 | 0.10 | 5.0 | 0.10 | 1.0 |
| Invention sample 8 | 0.79 | 0.15 | 5.0 | 0.06 | 2.5 |
| Invention sample 9 | 0.80 | 0.12 | 5.0 | 0.08 | 1.5 |
| Invention sample 10 | 0.80 | 0.12 | 5.0 | 0.08 | 1.5 |
| Invention sample 11 | 0.80 | 0.12 | 5.0 | 0.08 | 1.5 |
| Invention sample 12 | 0.80 | 0.12 | 5.0 | 0.08 | 1.5 |
| Invention sample 13 | 0.80 | 0.12 | 5.0 | 0.08 | 1.5 |
| Invention sample 14 | 0.80 | 0.12 | 3.0 | 0.08 | 1.5 |
| Invention sample 15 | 0.80 | 0.12 | 8.5 | 0.08 | 1.5 |
| Invention sample 16 | 0.75 | 0.13 | 5.0 | 0.12 | 1.1 |
| Invention sample 17 | 0.90 | 0.07 | 5.0 | 0.03 | 2.3 |
| Invention sample 18 | 0.80 | 0.12 | 5.0 | 0.08 | 1.5 |
| Invention sample 19 | 0.80 | 0.12 | 5.0 | 0.08 | 1.5 |
| Comparative sample 1 | 0.80 | 0.20 | 5.0 | 0.00 | — |
| Comparative sample 2 | 0.66 | 0.17 | 5.0 | 0.17 | 1.0 |
| Comparative sample 3 | 0.97 | 0.02 | 5.0 | 0.01 | 2.0 |
| Comparative sample 4 | 0.70 | 0.25 | 5.0 | 0.05 | 5.0 |
| Comparative sample 5 | 0.80 | 0.12 | 1.5 | 0.08 | 1.5 |
| Comparative sample 6 | 0.80 | 0.12 | 11.5 | 0.08 | 1.5 |
| Comparative sample 7 | 0.80 | 0.07 | 5.0 | 0.13 | 0.5 |
| Comparative sample 8 | 0.80 | 0.17 | 5.0 | 0.03 | 5.7 |
| Comparative sample 9 | 0.80 | 0.00 | 5.0 | 0.20 | 0.0 |
| Comparative sample 10 | 0.80 | 0.12 | 1.5 | 0.08 | 1.5 |

TABLE 2

| | Compound layer | | | |
|---|---|---|---|---|
| Sample No. | Temperature (° C.) | Voltage (V) | Current (A) | Pressure (Pa) |
| Invention sample 1 | 250 | –300 | 150 | 10.0 |
| Invention sample 2 | 250 | –300 | 150 | 10.0 |
| Invention sample 3 | 250 | –300 | 150 | 10.0 |
| Invention sample 4 | 250 | –300 | 150 | 10.0 |
| Invention sample 5 | 250 | –300 | 150 | 10.0 |
| Invention sample 6 | 250 | –300 | 150 | 10.0 |
| Invention sample 7 | 250 | –300 | 150 | 10.0 |
| Invention sample 8 | 250 | –300 | 150 | 10.0 |
| Invention sample 9 | 300 | –300 | 150 | 8.0 |
| Invention sample 10 | 300 | –200 | 150 | 9.0 |

TABLE 2-continued

| | Compound layer | | | |
|---|---|---|---|---|
| Sample No. | Temperature (° C.) | Voltage (V) | Current (A) | Pressure (Pa) |
| Invention sample 11 | 200 | −400 | 150 | 10.0 |
| Invention sample 12 | 250 | −400 | 150 | 8.0 |
| Invention sample 13 | 300 | −200 | 150 | 10.0 |
| Invention sample 14 | 250 | −300 | 150 | 10.0 |
| Invention sample 15 | 250 | −300 | 150 | 10.0 |
| Invention sample 16 | 250 | −300 | 150 | 10.0 |
| Invention sample 17 | 250 | −300 | 150 | 10.0 |
| Invention sample 18 | 280 | −250 | 150 | 10.0 |
| Invention sample 19 | 220 | −350 | 150 | 10.0 |
| Comparative sample 1 | 250 | −300 | 150 | 10.0 |
| Comparative sample 2 | 250 | −300 | 150 | 10.0 |
| Comparative sample 3 | 250 | −300 | 150 | 10.0 |
| Comparative sample 4 | 250 | −300 | 150 | 10.0 |
| Comparative sample 5 | 250 | −300 | 150 | 10.0 |
| Comparative sample 6 | 250 | −300 | 150 | 10.0 |
| Comparative sample 7 | 250 | −300 | 150 | 10.0 |
| Comparative sample 8 | 250 | −300 | 150 | 10.0 |
| Comparative sample 9 | 250 | −300 | 150 | 10.0 |
| Comparative sample 10 | 350 | −120 | 150 | 5.0 |

An average thickness of the compound layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The results are shown in Table 1.

The composition of the compound layer of the obtained sample was measured by using an EDS attached to the TEM in a cross section in the vicinity of the position 50 μm from the cutting edge ridgeline portion of the surface of the coated cutting tool facing the metal evaporation source toward the center portion. Measurement results are also shown in Table 1. Composition ratios of metal elements in the compound layer in Table 1 indicate atomic ratios of the metal elements to the entire metal element in a metal compound forming the compound layer.

$I_{hex}(100)/I_{cub}(200)$

The ratio $I_{hex}(100)/I_{cub}(200)$ in the compound layer of the obtained samples was measured by using a model: RINT TTRIII, which is an X-ray diffractometer manufactured by Rigaku Co., Ltd. Specifically, the ratio $I_{hex}(100)/I_{cub}(200)$ was calculated by measuring the peak intensity $I_{cub}(200)$ of the (200) plane of the compound layer and the peak intensity $I_{hex}(100)$ of the (100) plane of the compound layer by X-ray diffraction measurement with a 2θ/θ focused optical system using Cu-Kα rays under the conditions of output: 50 kV, 250 mA, incident side solar slit: 5°, divergent vertical slit: 2/3°, divergent vertical limiting slit: 5 mm, scattering slit: 2/3°, light receiving side solar slit: 5°, light receiving slit: 0.3 mm, BENT monochromator, light receiving monochrome slit: 0.8 mm, sampling width: 0.01°, scan speed: 4°/min, and 2θ measurement range: 20° to 50°. The results are shown in Table 3. The crystal system of the compound layer was also confirmed by X-ray diffraction measurement.

Residual Stress

For the obtained samples, the residual stress was measured by a $\sin^2\varphi$ method using an X-ray diffractometer. The stress at any three points included in the part involved in cutting was measured, and the average value (arithmetic mean value) was taken as the residual stress of the compound layer. The results are shown in Table 3.

Grain Shape, Aspect Ratio and Average Grain Size

The shape, aspect ratio and average grain size of the grains in the compound layer of the obtained samples were measured by using a commercially available transmission electron microscope (TEM). Specifically, for example, first, by using a focused ion beam (FIB) processing machine, a thin-film sample with a cross section of the compound layer (a cross section in a direction same as a direction of observing the thickness of the coating layer: perpendicular to the surface of the substrate) as an observation surface was prepared. A photograph of a scanning transmission electron image (STEM image) was taken on the observation surface of the prepared sample. The STEM image at this time included the entire region occupied by the compound layer in the direction perpendicular to the substrate, and included a region of 10 μm or more in the direction parallel to the surface of the substrate. In the taken photograph, the value of an axis in the direction parallel to the surface of the substrate in a grain constituting the compound layer was taken as the grain size for all the grains present in the compound layer, and the average value thereof was taken as the average grain size of the compound layer.

Further, the aspect ratio of the compound layer was obtained in the following manner. In the crystal grains used for measuring the average grain size, the size of the axis in the thickness direction of the coating layer was taken as the height of the crystal grain. The value obtained by dividing the height of the crystal grain by the value of the grain size was taken as the aspect ratio.

When the number of crystal grains having an aspect ratio of 2 or more in the compound layer measured as described above was 50% or more of the total number of crystal grains, it was assumed that the columnar crystal structure was realized. Further, when the number of crystal grains having an aspect ratio of 2 or more in the compound layer measured as described above was less than 50% of the total number of crystal grains, that is, the number of crystal grains having an aspect ratio of less than 2 was 50% or more of the total number of crystal grains, it was assumed that a granular crystal structure was realized. The results related to the shape and average grain size of each identified grain are shown in Table 3.

TABLE 3

| | Compound layer | | | |
|---|---|---|---|---|
| Sample No. | $I_{hex}(100)/I_{cub}(200)$ | Residual stress (GPa) | Composition | Average grain size (nm) |
| Invention sample 1 | 0 | −4.5 | Columnar crystal | 135 |
| Invention sample 2 | 0 | −4.3 | Columnar crystal | 144 |
| Invention sample 3 | 0.16 | −4.6 | Columnar crystal | 126 |
| Invention sample 4 | 0 | −4.5 | Columnar crystal | 140 |
| Invention sample 5 | 0 | −4.4 | Columnar crystal | 125 |
| Invention sample 6 | 0 | −4.5 | Columnar crystal | 142 |

TABLE 3-continued

| Sample No. | Compound layer | | | |
|---|---|---|---|---|
| | $I_{hex}(100)/I_{cub}(200)$ | Residual stress (GPa) | Composition | Average grain size (nm) |
| Invention sample 7 | 0 | −4.6 | Columnar crystal | 132 |
| Invention sample 8 | 0 | −4.4 | Columnar crystal | 138 |
| Invention sample 9 | 0.2 | −4.3 | Columnar crystal | 128 |
| Invention sample 10 | 0 | −3.5 | Columnar crystal | 14 |
| Invention sample 11 | 0 | −5.1 | Columnar crystal | 292 |
| Invention sample 12 | 0 | −9.6 | Columnar crystal | 154 |
| Invention sample 13 | 0 | −2.5 | Columnar crystal | 130 |
| Invention sample 14 | 0 | −4.4 | Columnar crystal | 131 |
| Invention sample 15 | 0 | −4.6 | Columnar crystal | 137 |
| Invention sample 16 | 0 | −4.5 | Columnar crystal | 135 |
| Invention sample 17 | 0.08 | −4.5 | Columnar crystal | 135 |
| Invention sample 18 | 0 | −2.8 | Columnar crystal | 38 |
| Invention sample 19 | 0 | −6.9 | Columnar crystal | 276 |
| Comparative sample 1 | 0 | −4.4 | Columnar crystal | 135 |
| Comparative sample 2 | 0 | −4.3 | Columnar crystal | 144 |
| Comparative sample 3 | 0.8 | −4.5 | Granular crystal | 11 |
| Comparative sample 4 | 0 | −4.4 | Columnar crystal | 140 |
| Comparative sample 5 | 0 | −4.4 | Columnar crystal | 125 |
| Comparative sample 6 | 0 | −4.6 | Columnar crystal | 142 |
| Comparative sample 7 | 0.3 | −4.5 | Columnar crystal | 60 |
| Comparative sample 8 | 0.12 | −4.4 | Columnar crystal | 138 |
| Comparative sample 9 | 0.05 | −2.2 | Granular crystal | 30 |
| Comparative sample 10 | 0 | −11.0 | Granular crystal | 9 |

By using the obtained sample, the following cutting test was performed, and the results thereof were evaluated.

Cutting Test
  Work material: FCD600
  Work material shape: 60 mm×100 mm×200 mm plate
  Cutting speed: 150 m/min
  Feed per tooth: 0.2 mm/tooth,
  Depth of cut: 2.0 mm
  Width of cut: 100 mm
  Coolant: Dry (not used)
  Evaluation items: the tool life was assumed when the sample was chipped (width 0.2 mm or more) or fractured, and the processing time until the tool life was measured. In the present cutting test, the processing conditions are set so that sudden fractures are unlikely to occur, and as the flank wear of the sample progresses, chipping or fractures occur due to insufficient strength of the cutting edge. Therefore, it means that the longer the machining time until the tool life is, the better the fracture resistance and the wear resistance are, and particularly the wear resistance is excellent. The results of the obtained evaluation are shown in Table 4.

TABLE 4

| Sample No. | Cutting test Tool life (min) |
|---|---|
| Invention sample 1 | 90 |
| Invention sample 2 | 85 |
| Invention sample 3 | 83 |
| Invention sample 4 | 84 |
| Invention sample 5 | 82 |
| Invention sample 6 | 98 |
| Invention sample 7 | 88 |
| Invention sample 8 | 94 |
| Invention sample 9 | 80 |
| Invention sample 10 | 92 |
| Invention sample 11 | 88 |
| Invention sample 12 | 90 |
| Invention sample 13 | 86 |
| Invention sample 14 | 84 |
| Invention sample 15 | 94 |
| Invention sample 16 | 86 |
| Invention sample 17 | 85 |
| Invention sample 18 | 91 |
| Invention sample 19 | 89 |
| Comparative sample 1 | 38 |
| Comparative sample 2 | 45 |
| Comparative sample 3 | 42 |
| Comparative sample 4 | 48 |
| Comparative sample 5 | 37 |
| Comparative sample 6 | 43 |
| Comparative sample 7 | 33 |
| Comparative sample 8 | 47 |
| Comparative sample 9 | 55 |
| Comparative sample 10 | 35 |

From the results shown in Table 4, the processing time of the invention samples was 80 min or more, which was longer than the processing time of all the comparative samples.

From the above results, it was found that the tool life of the invention was extended by improving the wear resistance and the fracture resistance.

INDUSTRIAL APPLICABILITY

Since the coated cutting tool of the invention is excellent in the wear resistance and the fracture resistance, the tool life can be extended as compared with that in the related art. Therefore, the coated cutting tool has high industrial applicability in this respect.

REFERENCE SIGNS LIST

1: Substrate, 2: Coating layer, 3: Coated cutting tool

What is claimed is:
1. A coated cutting tool comprising a substrate and a coating layer formed on the substrate, wherein the coating layer comprises a compound layer containing a compound having a composition represented by a following formula (1):

$$(Al_xCr_yTi_{1-x-y})N \quad (1)$$

(in the formula (1), x represents an atomic ratio of an Al element to a total of the Al element, a Cr element and a Ti element and satisfies $0.70 \le x \le 0.95$, and y represents an atomic ratio of a Cr element to a total of an Al element, the Cr element and a Ti element and satisfies $0.04 \le y \le 0.21$, and $1-x-y>0$);

a ratio (Cr/Ti) of the Cr element and the Ti element in the compound layer is 1.0 or more and 2.5 or less; and an average thickness of the compound layer is 2.0 μm or more and 10.0 μm or less.

2. The coated cutting tool according to claim 1, wherein a residual stress of the compound layer is −10.0 GPa or more and −2.0 GPa or less.

3. The coated cutting tool according to claim 1, wherein an average grain size of grains in the compound layer is 10 nm or more and 300 nm or less.

4. The coated cutting tool according to claim 1, wherein where a diffraction peak intensity of a cubic crystal (200) plane is denoted by $I_{cub}(200)$ and a diffraction peak intensity of a hexagonal crystal (100) plane is denoted by $I_{hex}(100)$, $I_{hex}(100)/I_{cub}(200)$ is 0.2 or less.

5. The coated cutting tool according to claim 1, wherein the compound layer comprises a columnar crystal structure.

6. The coated cutting tool according to claim 2, wherein an average grain size of grains in the compound layer is 10 nm or more and 300 nm or less.

7. The coated cutting tool according to claim 2, wherein where a diffraction peak intensity of a cubic crystal (200) plane is denoted by $I_{cub}(200)$ and a diffraction peak intensity of a hexagonal crystal (100) plane is denoted by $I_{hex}(100)$, $I_{hex}(100)/I_{cub}(200)$ is 0.2 or less.

8. The coated cutting tool according to claim 3, wherein where a diffraction peak intensity of a cubic crystal (200) plane is denoted by $I_{cub}(200)$ and a diffraction peak intensity of a hexagonal crystal (100) plane is denoted by $I_{hex}(100)$, $I_{hex}(100)/I_{cub}(200)$ is 0.2 or less.

9. The coated cutting tool according to claim 6, wherein where a diffraction peak intensity of a cubic crystal (200) plane is denoted by $I_{cub}(200)$ and a diffraction peak intensity of a hexagonal crystal (100) plane is denoted by $I_{hex}(100)$, $I_{hex}(100)/I_{cub}(200)$ is 0.2 or less.

10. The coated cutting tool according to claim 2, wherein the compound layer comprises a columnar crystal structure.

11. The coated cutting tool according to claim 3, wherein the compound layer comprises a columnar crystal structure.

12. The coated cutting tool according to claim 4, wherein the compound layer comprises a columnar crystal structure.

13. The coated cutting tool according to claim 6, wherein the compound layer comprises a columnar crystal structure.

14. The coated cutting tool according to claim 7, wherein the compound layer comprises a columnar crystal structure.

15. The coated cutting tool according to claim 8, wherein the compound layer comprises a columnar crystal structure.

16. The coated cutting tool according to claim 9, wherein the compound layer comprises a columnar crystal structure.

17. The coated cutting tool according to claim 1, wherein in the formula (1), the amount of Ti element satisfies $0.12 \le 1-x-y \le 0.15$.

* * * * *